United States Patent
Tsai et al.

(10) Patent No.: US 6,537,849 B1
(45) Date of Patent: Mar. 25, 2003

(54) SEAL RING STRUCTURE FOR RADIO FREQUENCY INTEGRATED CIRCUITS

(75) Inventors: Chao-Chieh Tsai, Hsin-Chu (TW); Shih Chih Wong, Taichung (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/933,965

(22) Filed: Aug. 22, 2001

(51) Int. Cl.7 .................. H01L 21/44; H01L 21/48; H01L 21/50
(52) U.S. Cl. ............................. 438/106; 438/637
(58) Field of Search .................... 438/106, 637

(56) References Cited

U.S. PATENT DOCUMENTS

| | | | |
|---|---|---|---|
| 5,717,245 A | 2/1998 | Pedder | 257/691 |
| 5,831,330 A * | 11/1998 | Chang | 257/619 |
| 5,864,092 A | 1/1999 | Gore et al. | 174/52.4 |
| 5,981,384 A * | 11/1999 | Juengling | 438/637 |
| 5,998,245 A | 12/1999 | Yu | 438/140 |
| 6,028,347 A | 2/2000 | Sauber et al. | 257/622 |
| 6,028,497 A | 2/2000 | Allen et al. | 333/246 |
| 6,054,376 A * | 4/2000 | Balakrishnan | 438/612 |
| 6,105,226 A | 8/2000 | Gore et al. | 29/25.35 |
| 6,420,208 B1 * | 7/2002 | Pozder et al. | 257/738 |

* cited by examiner

Primary Examiner—John F. Niebling
Assistant Examiner—Angel Roman
(74) Attorney, Agent, or Firm—George O. Saile; Stephen B. Ackerman; Rosemary L. S. Pike

(57) ABSTRACT

Described is a method wherein a seal ring is formed by patterning multiple layers each comprised of a dielectric layer with conductive vias covered by a conductive layer. Discontinuities are made in the seal ring encapsulating an integrated circuit. There are no overlaps between different sections of the seal ring thereby reducing coupling of high frequency circuits in the seal ring structures. In addition, the distance between signal pads, circuits and the seal ring are enlarged. Electrical connection is made between deep N-wells and the seal ring. This encapsulates the integrated circuit substrate and reduces signal coupling with the substrate.

27 Claims, 2 Drawing Sheets

SEAL RING STRUCTURE FOR RADIO FREQUENCY INTEGRATED CIRCUITS

BACKGROUND OF THE INVENTION (1) Field of the Invention

The invention generally relates to an encapsulation process used in semiconductor manufacturing and, more particularly, to a method of encapsulation that improves isolation of radio frequency (RF) signals in the fabrication of integrated circuits.

(2) Description of Prior Art

As integrated circuit (IC) speeds increase, seal rings have been incorporated into the device encapsulation in order to reduce radio frequency (RF) interference and signal cross coupling. The seal ring is grounded or connected to a signal ground such as a DC supply line to eliminate the effect of interference. The seal ring may be part of the device packaging scheme; in this case a conductive lid is typically connected to the seal ring. Specific to this invention, the seal ring may be incorporated into the IC substrate fabrication and may include a conductive covering over the substrate.

FIG. 1 shows in exploded view a method where the seal ring is incorporated into the device package. A substrate 10 made of ceramic material, for example, has an integrated circuit die 12 attached by a conductive epoxy or eutectic bond. The die 12 is electrically connected to the substrate 10 using bond wires (not shown). A conductive seal ring 14 is attached and grounded by internal connections (not shown). The package is sealed using a lid 16 to prevent penetration by contaminants and moisture.

FIG. 2 shows a top view of an IC die 20 where a seal ring 22 is incorporated. A plurality of bonding pads 24 are shown which may be either signal inputs or outputs, or DC supply and ground. A portion of the circuit containing RF circuits 26 is shown. One problem with this method is that signals from the bonding pads 24 may be capacitively coupled to the seal ring 22. This may result in unwanted signal interference appearing at one of the signal input or output bonding pads 24. In addition, interference may be coupled to the RF circuit 26 resulting in signal distortion.

Other approaches employing seal rings exist. U.S. Pat. No. 5,717,245 to Pedder teaches a system using a dielectric multi-layer substrate where RF interference is reduced by grounding certain areas and encapsulating the substrate within a conductive seal ring. U.S. Pat. No. 6,028,497 to Allen et al. teaches a system where RF signals are passed through a network of holes in the base plate of the module. The holes each consist of a conductive pin surrounded by, but electrically isolated from, a conductive cylindrical shroud, thereby forming a coaxial connection. A compartmentalized seal ring attached to the top of the module segregates different circuit areas of the module. U.S. Pat. Nos. 5,864,092 and 6,105,226 to Gore et al. teach methods employing a leadless chip carrier package where a grounded conductor protrudes between input and output signal pads thereby preventing interference. U.S. Pat. No. 5,998,245 to Yu teaches a method where ESD protection is incorporated into a seal ring structure on an IC die. U.S. Pat. No. 6,028,347 to Sauber et al. teaches a method where a portion of the seal ring is formed in trenches in the semiconductor surface. An encapsulating plastic covering over the surface fills the trenches thereby preventing movement of the cover and reducing stresses due to thermal expansion.

SUMMARY OF THE INVENTION

A principal object of the present invention is to provide a method that reduces cross coupling between circuits and pads in an integrated circuit.

Another object of the present invention is to provide a method that prevents cross coupling between circuits caused by the seal ring in an integrated circuit.

These objects are achieved by using a method where a seal ring is formed by stacking interconnected metal layers along the perimeter of the integrated circuit (IC). Discontinuities are formed in the seal ring encapsulating different sections of the IC. There are no overlaps between discontinuities in the seal ring thus isolating signals utilized on different sub-circuits within the IC. To further reduce unwanted signal coupling, the distances between the seal ring and both signal pads and circuits are enlarged. Electrical connection is made between the deep N-well and the seal ring to encapsulate the substrate and minimized signal coupling to the substrate.

BRIEF DESCRIPTION OF THE DRAWINGS

In the accompanying drawings forming a material part of this description, there is shown.

DESCRIPTION OF THE PREFERRED EMBODIMENTS

The present invention uses a method where a seal ring is formed by stacking interconnected conducting layers along the perimeter of the integrated circuit (IC). The embodiment provided herein describes a method of creating the seal ring and connecting the seal ring to the deep N-well.

Figure 1:
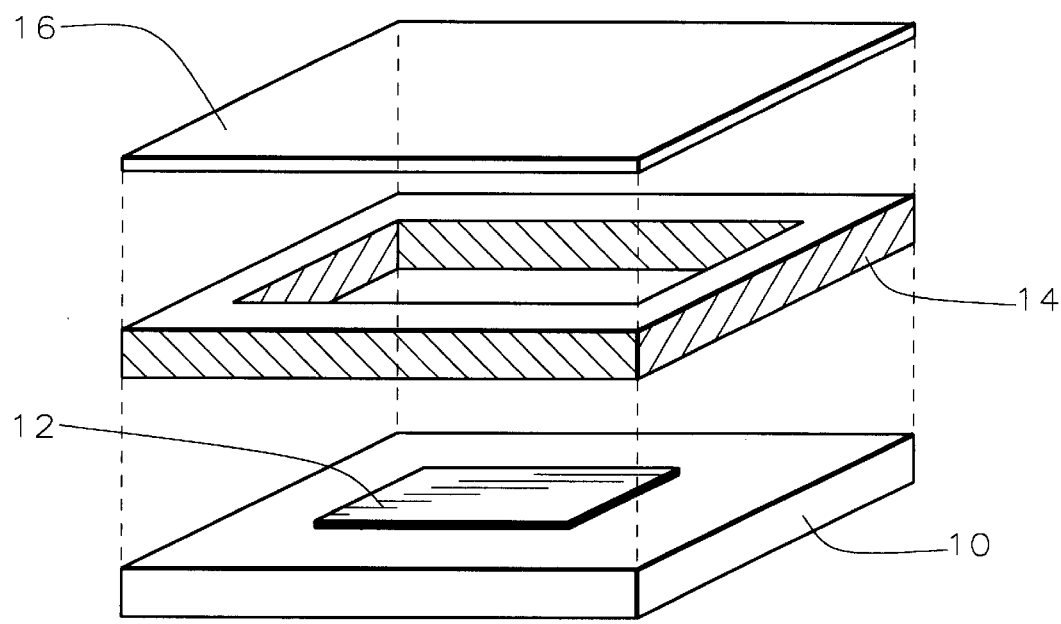
FIG. 1 schematically illustrating an exploded view cross-sectional representation of a prior art example employing seal rings.
Figure 2:
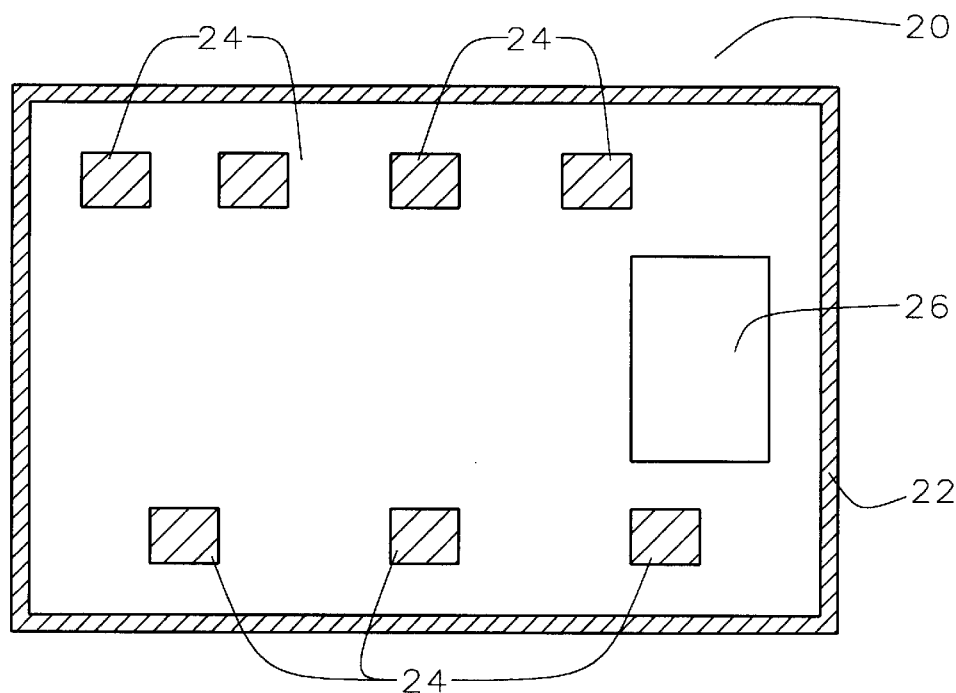
FIG. 2 schematically illustrating a top view cross-sectional representation of a prior art example employing seal rings.
Figure 3:
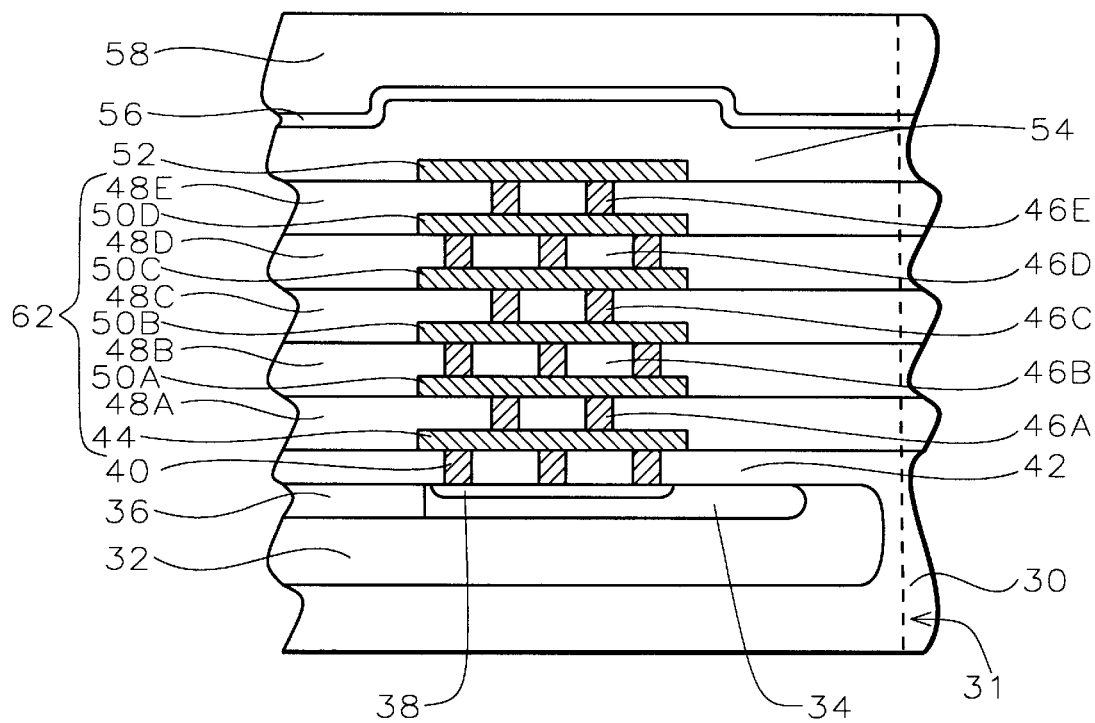
FIG. 3 schematically illustrating in cross-sectional representation a preferred embodiment of the present invention.

Refer to FIG. 3, depicting in cross-section a portion of an integrated circuit die where the seal ring is formed. A substrate 30 is provided. The substrate layer 30 may contain underlying layers, devices, junctions, and other features (not shown) formed during prior process steps. The cut line 31 represents the outer edge of the IC die of interest. During subsequent processing, the die would be separated from an adjacent IC die (not shown) on the substrate 30 along that cut line 31. A deep N-well region 32 is formed as is conventional in the art. A p+ source/drain (S/D) region 34 formed by conventional techniques is isolated from the remainder of the underlying circuitry (not shown) by shallow trench isolation 36. A silicide 38 is formed over the S/D region 34 providing a low resistance connection to the S/D region 34. Contacts 40 through first interlevel dielectric layer 42 make electrical connection to the first conductive layer 44. A plurality of via layers 46a–46e through dielectric layers 48a–48e, respectively, make electrical contact to a plurality of conductive layers 44 and 50a–50d, respectively. A top conductive layer 52 is then provided. This is followed by a passivation layer 54 composed of USG oxide, for example, deposited by chemical vapor deposition (CVD), for example, to a thickness of between about 8000 Å and 20,000 Å. This completes the seal ring 62 composed of the conductive layers 44, 50a–50d and 52 and via layers 46a–46e. The seal ring 62 makes electrical contact to the deep N-well 32 via contact 40, silicide 38 and S/D region 24. Typical widths of the seal ring 62 are between about 5 µm to 15 µm.

A nitride layer 56 composed of Si$_3$N4 is then conformally deposited by CVD to a thickness of between about 2000 Å and 10,000 Å. The CVD process provides excellent step coverage along the sidewalls of the structure. A polyimide layer 58 is then deposited by spin-on techniques to a thickness of between about 2 µm and 6 µm.

When the completed IC is electrically connected in a circuit, the deep N-well 32 is electrically connected to a positive supply voltage (Vdd) thereby holding the deep N-well 32 and seal ring 62 at signal ground. This minimizes signal coupling within the substrate and the S/D region.

Figure 4:
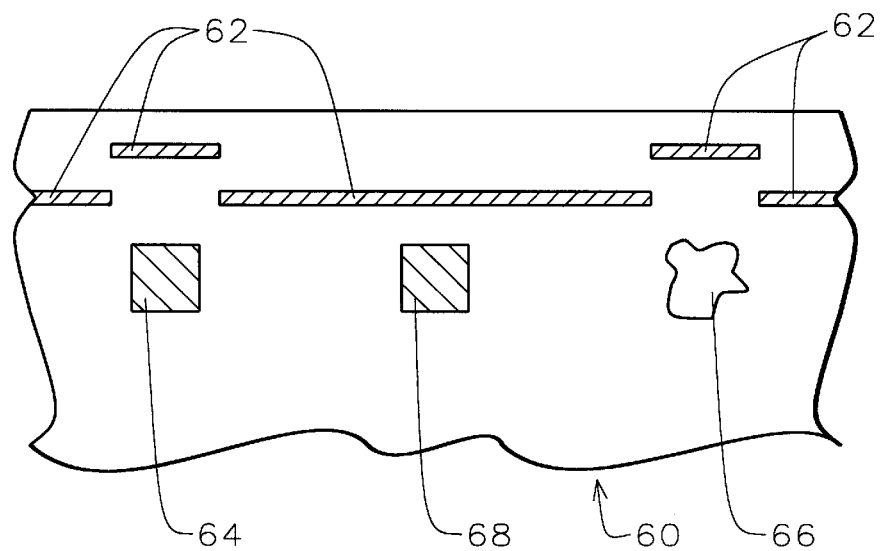
FIG. 4 schematically illustrating a top view of a preferred embodiment of the present invention.

Referring now to FIG. 4 showing a top view of a portion of an integrated circuit 60, a portion of seal ring 62 and an important point of the present invention is depicted. Notice that there are discontinuities in the seal ring 62. More specifically, the seal ring 62 is spaced further from signal pad 64 and radio frequency circuit 66 than from signal ground pad 68. Typical distances between the seal ring and signal ground pads would be between about 10 µm and 30 µm, while distances between the seal ring and signal pins would be between about 20 µm and 50 µm. It should be noted that both DC ground pins and fixed DC voltage supply pins are effectively signal grounds. The additional spacing between the seal ring 62 and signal pads 64 and radio frequency circuits 66 reduces the coupling between distinct circuits. The breaks in the seal ring 62 prevent interference from being propagated to other sub-circuits within the integrated circuit. It should also be noted that preferably, the seal ring 62 breaks do not overlap along the perimeter of the integrated circuit 60; this further reduces the potential for signal interference. If the seal ring 60 breaks must overlap (not preferred), then the distance between the different portions of the seal ring must be increased.

The present invention is achieved by using a method where a seal ring is formed by stacking interconnected conductive layers along the perimeter of the IC. Discontinuities formed in the seal ring encapsulating different sections of the IC isolate signals utilized on different sub-circuits within the IC. To further reduce unwanted signal coupling, the distances between the seal ring and both signal pads and circuits are enlarged. Electrical connection made between the deep N-well and the seal ring encapsulates the substrate and minimizes signal coupling to the substrate.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit seal ring comprising:
   providing an active area including semiconductor device structures; and
   forming a plurality of stacked, interconnected, conductive layers each of which is formed by steps comprising:
   depositing an inter-metal dielectric layer;
   etching openings through said inter-metal dielectric layer;
   filling said openings with a conductive via layer; and
   depositing and patterning a conductive metal layer to make contact to said conductive via layer filling said openings in said inter-metal dielectric layer, wherein a first of said conductive via layers makes electrical contact to signal ground points within the substrate of said active area, and wherein each of subsequent said conductive via layers makes electrical contact to previous patterned said conductive metal layer.

2. The method according to claim 1 wherein said seal ring is positioned such that signal pads are kept a minimum of 20 microns apart from said seal ring.

3. The method according to claim 2 wherein said seal ring is constructed such that discontinuities in said seal ring occur near said signal pads thereby electrically isolating different sections of said seal ring.

4. The method according to claim 1 wherein said seal ring is positioned such that radio frequency circuitry contained within said active area are kept a minimum of 20 microns apart from said seal ring.

5. The method according to claim 4 wherein said seal ring is constructed such that discontinuities in said seal ring occur near radio frequency circuitry contained within said active area thereby electrically isolating different sections of said seal ring.

6. A method of fabricating an integrated circuit seal ring comprising:
   providing an active area including semiconductor device structures wherein said semiconductor device structures include N-wells and further comprise:
   providing p+ regions within one or more of said N-wells;
   isolating said p+ regions from said other semiconductor device structures by providing a shallow trench isolation region; and
   forming a salicide region on the surface of said p+ regions thereby providing a low resistance contact to said p+ regions; and
   forming a plurality of stacked, interconnected, conductive layers each of which is formed by steps comprising:
   depositing an inter-metal dielectric layer;
   etching openings through said inter-metal dielectric layer;
   filling said openings with a conductive via layer; and
   depositing and patterning a conductive metal layer to make contact to said conductive via layer filling said openings in said inter-metal dielectric layer, wherein a first of said conductive via layers makes electrical contact to said silicide region within the substrate of said active area, and wherein each of subsequent said conductive via layers makes electrical contact to previous patterned said conductive metal layer.

7. The method according to claim 6 wherein said seal ring is positioned such that signal pads are kept a minimum of 20 microns apart from said seal ring.

8. The method according to claim 7 wherein said seal ring is constructed such that discontinuities in said seal ring occur near said signal pads thereby electrically isolating different sections of said seal ring.

9. The method according to claim 6 wherein said seal ring is positioned such that radio frequency circuitry contained within said active area are kept a minimum of 20 microns apart from said seal ring.

10. The method according to claim 9 wherein said seal ring is constructed such that discontinuities in said seal ring occur near radio frequency circuitry contained within said active area thereby electrically isolating different sections of said seal ring.

11. A method of fabricating an integrated circuit seal ring comprising:
   providing an active area including semiconductor device structures wherein said semiconductor device structures include N-wells and further comprise:
   providing p+ regions within one or more of said N-wells;
   isolating said p+ regions from said other semiconductor device structures by providing a shallow trench isolation region; and forming a salicide region on the surface of said p+ regions thereby providing a low resistance contact to said p+ regions;

forming a plurality of stacked, interconnected, conductive layers each of which is formed by steps comprising:

depositing an inter-metal dielectric layer;

etching openings through said inter-metal dielectric layer;

filling said openings with a conductive via layer; and depositing and patterning a conductive metal layer to make contact to said conductive via layer filling said openings in said inter-metal dielectric layer, wherein a first of said conductive via layers makes electrical contact to said silicide region within the substrate of said active area, and wherein each of subsequent said conductive via layers makes electrical contact to previous patterned said conductive metal layer;

depositing a passivation layer overlying said plurality of stacked, interconnected conductive layers; and depositing a polyimide layer to complete fabrication of said integrated circuit seal ring.

12. The method according to claim 11 wherein said passivation layer is composed of USG deposited by chemical vapor deposition (CVD) at a thickness of between about 8000 and 20,000 Angstroms.

13. The method according to claim 11 wherein said seal ring is positioned such that signal pads are kept a minimum of 20 microns apart from said seal ring.

14. The method according to claim 13 wherein said seal ring is constructed such that discontinuities in said seal ring occur near said signal pads thereby electrically isolating different sections of said seal ring.

15. The method according to claim 11 wherein said seal ring is positioned such that radio frequency circuitry contained within said active area are kept a minimum of 20 microns apart from said seal ring.

16. The method according to claim 15 wherein said seal ring is constructed such that discontinuities in said seal ring occur near radio frequency circuitry contained within said active area thereby electrically isolating different sections of said seal ring.

17. A method of fabricating an integrated circuit seal ring wherein there are discontinuities in said seal ring forming a plurality of sections of said seal ring, such that a spacing between signal pads and said seal ring and between radio frequency circuits and said seal ring is greater than a spacing between signal ground pads and said seal ring.

18. The method according to claim 17 wherein said spacing between said seal ring and said signal ground pads is between about 10 and 30 microns.

19. The method according to claim 17 wherein said spacing between said seal ring and said signal pads is between about 20 and 50 microns.

20. The method according to claim 17 wherein said spacing between said seal ring and said radio frequency circuits is between about 20 and 50 microns.

21. The method according to claim 17 wherein said discontinuities between said plurality of sections of said seal ring are between about 10 and 30 microns.

22. The method according to claim 17 wherein said seal ring layer is composed of a plurality of stacked, interconnected, conductive layers each of which is formed by steps comprising:

depositing an inter-metal dielectric layer;

etching openings through said inter-metal dielectric layer;

filling said openings with a conductive via layer; and depositing and patterning a conductive metal layer to make contact to said conductive via layer filling said openings in said inter-metal dielectric layer, wherein a first of said conductive via layers makes electrical contact to signal ground regions within active areas of a semiconductor substrate, and wherein each of subsequent said conductive via layers makes electrical contact to previous patterned said conductive metal layer.

23. A method of fabricating an integrated circuit seal ring comprising:

a plurality of stacked, interconnected, conductive layers each of which is formed by steps comprising:

depositing an inter-metal dielectric layer;

etching openings through said inter-metal dielectric layer;

filling said openings with a conductive via layer; and depositing and patterning a conductive metal layer to make contact to said conductive via layer filling said openings in said inter-metal dielectric layer, wherein a first of said conductive via layers makes electrical contact to signal ground regions within active areas of a semiconductor substrate, and wherein each of subsequent said conductive via layers makes electrical contact to previous patterned said conductive metal layer and wherein there are discontinuities in said seal ring forming a plurality of sections of said seal ring, such that a spacing between signal pads and said seal ring and between radio frequency circuits and said seal ring is greater than a spacing between signal ground pads and said seal ring.

24. The method according to claim 23 wherein said spacing between said seal ring and said signal ground pads is between about 10 and 30 microns.

25. The method according to claim 23 wherein said spacing between said seal ring and said signal pads is between about 20 and 50 microns.

26. The method according to claim 23 wherein said spacing between said seal ring and said radio frequency circuits is between about 20 and 50 microns.

27. The method according to claim 23 wherein said discontinuities between said plurality of sections of said seal ring are between about 10 and 30 microns.

* * * * *